United States Patent
Lee

(10) Patent No.: US 9,514,821 B2
(45) Date of Patent: Dec. 6, 2016

(54) DISCHARGE CIRCUIT

(71) Applicant: SK hynix Inc., Gyeonggi-do (KR)

(72) Inventor: Jae Ho Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 94 days.

(21) Appl. No.: 14/252,454

(22) Filed: Apr. 14, 2014

(65) Prior Publication Data

US 2015/0117115 A1 Apr. 30, 2015

(30) Foreign Application Priority Data

Oct. 28, 2013 (KR) ........................ 10-2013-0128492

(51) Int. Cl.
| | | |
|---|---|---|
| G11C 16/12 | (2006.01) | |
| G11C 16/08 | (2006.01) | |
| G11C 16/22 | (2006.01) | |
| G11C 16/30 | (2006.01) | |

(52) U.S. Cl.
CPC ............. G11C 16/08 (2013.01); G11C 16/225 (2013.01); G11C 16/30 (2013.01)

(58) Field of Classification Search
CPC ...................................................... G11C 16/12
USPC ..................................................... 365/185.25
See application file for complete search history.

(56) References Cited

U.S. PATENT DOCUMENTS

| | | | | |
|---|---|---|---|---|
| 5,986,923 | A * | 11/1999 | Zhang ................... | G11C 11/412 365/154 |
| 8,270,224 | B2 | 9/2012 | Macerola | |
| 2006/0044923 | A1* | 3/2006 | Hahn ....................... | G11C 8/08 365/230.06 |
| 2006/0250854 | A1* | 11/2006 | Lee ......................... | G11C 16/14 365/185.25 |
| 2006/0274564 | A1* | 12/2006 | Kim ....................... | G11C 16/12 365/100 |
| 2008/0175077 | A1* | 7/2008 | Lee ........................ | G11C 11/413 365/189.16 |
| 2011/0149643 | A1* | 6/2011 | Yoon ...................... | G11O 5/147 365/163 |
| 2014/0036609 | A1* | 2/2014 | Sridhara .......... | G11C 29/50016 365/201 |
| 2014/0327048 | A1* | 11/2014 | Chow ................. | H01L 27/0248 257/195 |

FOREIGN PATENT DOCUMENTS

KR   1020130047224   5/2013

* cited by examiner

*Primary Examiner* — Min Huang
(74) *Attorney, Agent, or Firm* — IP & T Group LLP

(57) ABSTRACT

A discharge circuit includes a first circuit connected between a high-voltage terminal and a connection node, wherein first circuit includes a depletion high voltage NMOS transistor of which a drain connected to the high-voltage terminal, a source connected to the connection node, and a gate receiving a reference voltage, and a second circuit connected between a power supply voltage terminal and the connection node and suitable for discharging the connection node through the power supply voltage terminal when a power-off of a power supply voltage occurs. The discharge circuit may stably perform a discharge operation in the case of sudden power-off.

10 Claims, 6 Drawing Sheets

CHARGING   DISCHARGING

DISCHARGE CIRCUIT

CROSS-REFERENCE TO RELATED APPLICATION

The present application claims priority to Korean patent application number 10-2013-0128492 filed on Oct. 28, 2013, in the Korean Intellectual Property Office, the entire disclosure of which is incorporated by reference herein.

BACKGROUND

1. Technical Field

Various embodiments of the present invention relate to a semiconductor design technology, and more particularly to a discharge circuit.

2. Related Art

In general, electronic products externally receive power and use the power to perform various operations. When sudden power-off occurs, an electronic product may not ensure a normal operation.

Similarly, a semiconductor device may be driven using external power supply. For example, a NAND flash memory may operate using the external power supply. In a normal operation, the NAND flash memory may internally generate a high voltage (i.e., a boosted voltage) using the external power supply, use the high voltage for a specific block, and perform write, read, and erase operations. To this end, the NAND flash memory may include a high-voltage generating circuit configured to generate the high voltage using the external power supply. In the case of sudden power-off, the high voltage used during a read or write operation may not be normally discharged so that stored data may be distorted or errors may occur in the read operation.

Basically, after a NAND flash memory finishes a write or read operation, a high voltage needs to be safely lowered using a discharge operation so that the NAND flash memory may be put into a standby mode. However, when sudden power-off occurs, the NAND flash memory may not perform a normal discharge operation so that operational errors may occur.

SUMMARY

Various embodiments of the present invention are directed to a discharge circuit capable of stably performing a normal discharge operation in case of sudden power-off.

One aspect of the present invention provides a discharge circuit including a first circuit connected between a high-voltage terminal and a connection node, wherein first circuit includes a depletion high voltage NMOS transistor of which a drain connected to the high-voltage terminal, a source connected to the connection node, and a gate receiving a reference voltage, and a second circuit connected between a power supply voltage terminal and the connection node and suitable for discharging the connection node through the power supply voltage terminal when a power-off of a power supply voltage occurs.

Another aspect of the present invention provides a discharge circuit including a first circuit connected between a high-voltage terminal and a first connection node, wherein first circuit includes a first depletion NMOS transistor of which a drain connected to the high-voltage terminal, a source connected to the first connection node, and a gate receiving a reference voltage, a inverter circuit connected between the first connection node and a ground and suitable for outputting a discharge signal in response to a level of a power supply voltage and a second circuit connected between a power supply voltage terminal and the high-voltage terminal suitable for discharging the high-voltage terminal in response to the discharge signal.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION

Figure 1:
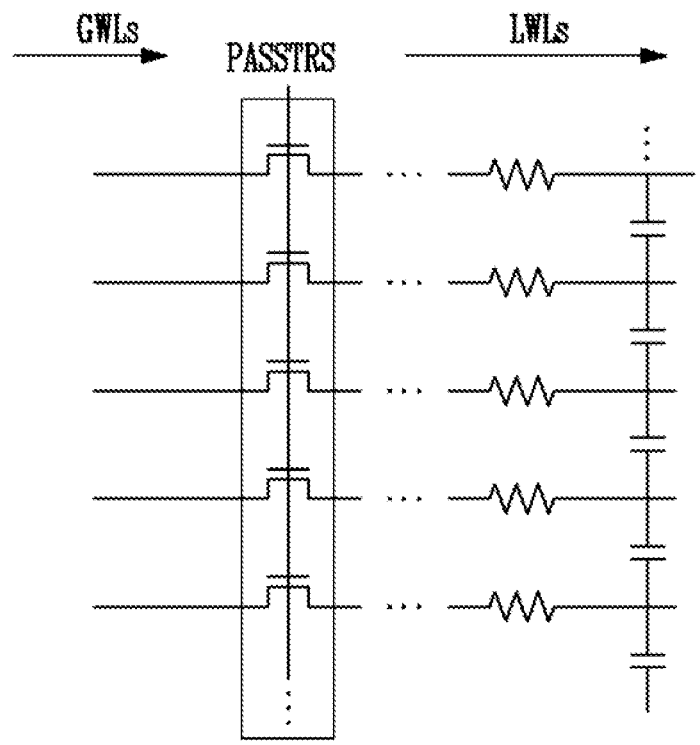
FIG. 1 is a diagram illustrating a word line scheme of a semiconductor memory device.

The present invention will now be described more fully hereinafter with reference to the accompanying drawings, in which exemplary embodiments of the present invention are shown. Throughout the disclosure, reference numerals correspond directly to the like numbered parts in the various figures and embodiments of the present invention. Descriptions of well-known functions and elements are omitted so as not to unnecessarily obscure exemplary embodiments of the present invention.

As used herein, it will be understood that when an element is referred to as being "connected" or "coupled" to another element, it can be directly connected or coupled to the other element or indirectly connected or coupled to the other element by intervening another element therebetween. As used herein, it will be further understood that the terms "comprises," "comprising," "includes," and/or "including," when used herein, specify the presence of stated features, items, steps, operations, elements, and/or components, but do not preclude the presence or addition of one or more other features, items, steps, operations, elements, components, and/or groups thereof.

FIG. 1 is a diagram illustrating a word line scheme of a semiconductor memory device.

The semiconductor memory device includes a plurality of global word lines GWLs a plurality of pass transistors PASSTR, and a plurality of local word lines LWLs.

Referring to FIG. 1, to selectively transmit voltages of the global word lines GWLs to the local word lines LWLs, respectively, gates of the respective pass transistors PASSTRs may be controlled by a row decoder (or an X decoder). In this case, transmission of voltages (or signals) may be delayed due to parasitic impedance (illustrated in FIG. 1 as capacitors) of the local word lines LWLs. To enable a normal write operation of the semiconductor memory device, a charging operation may be performed to transmit charges to the local word lines LWLs through the global word lines GWLs. When the charge operation ends, a discharge operation may be performed to discharge the charges of the LWL 130 through a discharge path.

When sudden power-off occurs for some reasons, an internal circuit of the semiconductor device may not perform a normal discharge operation, so that operational errors may occur.

Figure 2:
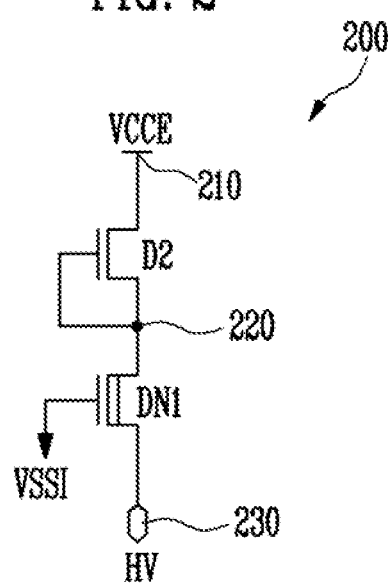
FIG. 2 is a diagram illustrating a discharge circuit according to a first exemplary embodiment of the present invention.

FIG. 2 is a diagram illustrating a discharge circuit 200 according to a first exemplary embodiment of the present invention. Referring to FIG. 2, the discharge circuit 200 may include a first node 210 to which a power supply voltage VCCE is applied, a second node 220, and a high-voltage (HV) terminal 230. Further, the discharge circuit 200 may include a first circuit DN1 connected between the high-voltage node 230 and the second node 220 and a second circuit D2 connected between the first node 210 and the second node 220. The first circuit DN1 may include a depletion high voltage NMOS transistor of which a drain connected to the high-voltage node 230, a source connected to the second node 220, and a gate receiving a reference voltage VSSI. When a power supply voltage is reduced, for example, by a sudden power-off, the first circuit DN1 may discharge the high-voltage node 230 through the second node 220. In addition, when the power supply voltage VCCE is reduced, the second circuit D2 may discharge the second node 220 through the first node 210.

In addition, the second circuit D2 may include a low voltage NMOS transistor of which a source connected to the first node 210 and a gate and a drain connected to the second node 220. In this case, when a voltage level of the second node 220 is higher than a voltage level of the first node 210 by a threshold voltage Vth_lvn of the low voltage NMOS transistor, the low voltage NMOS transistor may be turned-on and may discharge the second node 220 through the first node 210.

In the first circuit DN1, a threshold voltage Vth_dhvn of the depletion high voltage NMOS transistor may have a negative value. Since the reference voltage VSSI (e.g., 0V) is applied to the gate of the depletion high voltage NMOS transistor, a voltage level of the second node 220 may have a positive value. For example, assuming that the threshold voltage Vth_dhvn of the depletion high voltage NMOS transistor is about −2.7V, the second node 220 of the discharge circuit 200 may have a voltage level of about 2.7V. However, a specific value of the threshold voltage Vth_dhvn of the depletion high voltage NMOS transistor is not limited thereto and may be appropriately selected depending on demands.

Since the power supply voltage VCCE is maintained in a normal operation, a voltage level of the second node 220 may not be higher than a voltage level of the first node 210 by the threshold voltage Vth_lvn of the low voltage NMOS transistor so that the second circuit D2 may be turned-off. For example, typically, assuming that the power supply voltage VCCE ranges from about 2.6V to 3.7V and the low voltage NMOS transistor has a threshold voltage Vth_lvn of about 1.1V, since the power supply voltage VCCE is applied to the first node 210, the sum of the voltage level of the first node 210 and the threshold voltage Vth_lvn of the low voltage NMOS transistor may range from about 3.7V to 4.8V, which may not be higher than a voltage (i.e., 2.7V) of the second node D2 by the threshold voltage Vth_lvn, so that the second circuit D2 may be turned-off. Accordingly, the second node 220 may not be discharged, the high-voltage node 230 may not be discharged, and normal read, write, and erase operations may be performed. Specific values of the threshold voltage Vth_lvn and power supply voltage VCCE of the low voltage NMOS transistor are not limited thereto and may be appropriately selected depending on demands.

When sudden power-off occurs during a normal operation, the power supply voltage VCCE may not be applied to drop a voltage level of the first node 210. When the voltage level of the first node 210 is dropped, a voltage level of the second node 220 may become higher than the sum of the power supply voltage VCCE and the threshold voltage Vth_lvn of the low voltage NMOS transistor so that the second circuit D2 may be turned-on. When the second circuit D2 is turned-on, the second node 220 may be discharged through the first node 210. Accordingly, the high-voltage node 230 may also be discharged to the first node 210 through the second node 220. For instance, since the power supply voltage VCCE is not applied in the case of sudden power-off, the first node 210 may have a voltage level of about 0V. Thus, the second node 220 may have a voltage level of about 2.7V, which may be higher than the sum (i.e., 1.1V) of the voltage of the first node 210 and the threshold voltage Vth_lvn of the low voltage NMOS transistor so that the second circuit D2 may be turned-on. Accordingly, the high-voltage node 230 may be discharged to the first node 210 through the second node 220.

In addition, since the reference voltage VSSI (e.g., 0V) is applied to the gate of the depletion high voltage NMOS transistor included in the first circuit DN1, the discharge circuit 200 may not be affected by variations in external factors but ensure constant operations. That is the first circuit DN1 may always ensure constant operations irrespective of external factors, and the second circuit D2 may substantially have a turn-on condition in a sudden power-off state. Thus, in the case of sudden power-off, the discharge circuit 200 may ensure constant operations without the influence of other external factors.

In another point of view, the discharge circuit 200 may perform a discharge operation when the threshold voltage Vth_dhvn of the depletion high voltage NMOS transistor is equal or higher than the sum of a voltage level of the power supply voltage VCCE and the threshold voltage Vth_lvn of the low voltage NMOS transistor.

The above-described operations of the discharge circuit according to the present invention will be described in further detail with reference to FIGS. 3 through 5.

Figure 3:
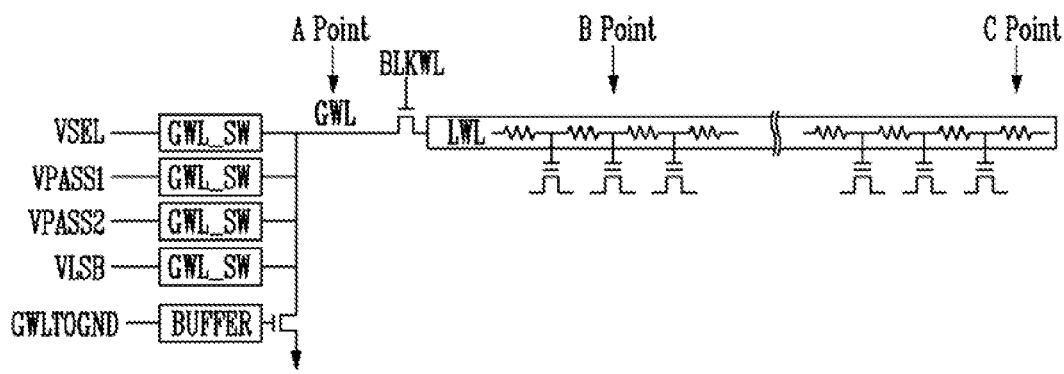
FIG. 3 is a detailed diagram showing the word line scheme shown in FIG. 1.

FIG. 3 is a detailed diagram of the word line scheme shown in FIG. 1. FIGS. 4 and 5 are graphs showing a voltage level in case of sudden power-off.

Referring to FIG. 3, voltages VSEL, VPASS1, VPASS2, and VLSB may be selectively applied to a global word line and a local word line through global word line switches GWL_SWs. Further, the global word line may be connected to a ground in response to a signal GWLTOGND applied through a buffer. In addition, the local word line may be cut off from the global word line using a pass transistor BLKWL.

Figure 4:
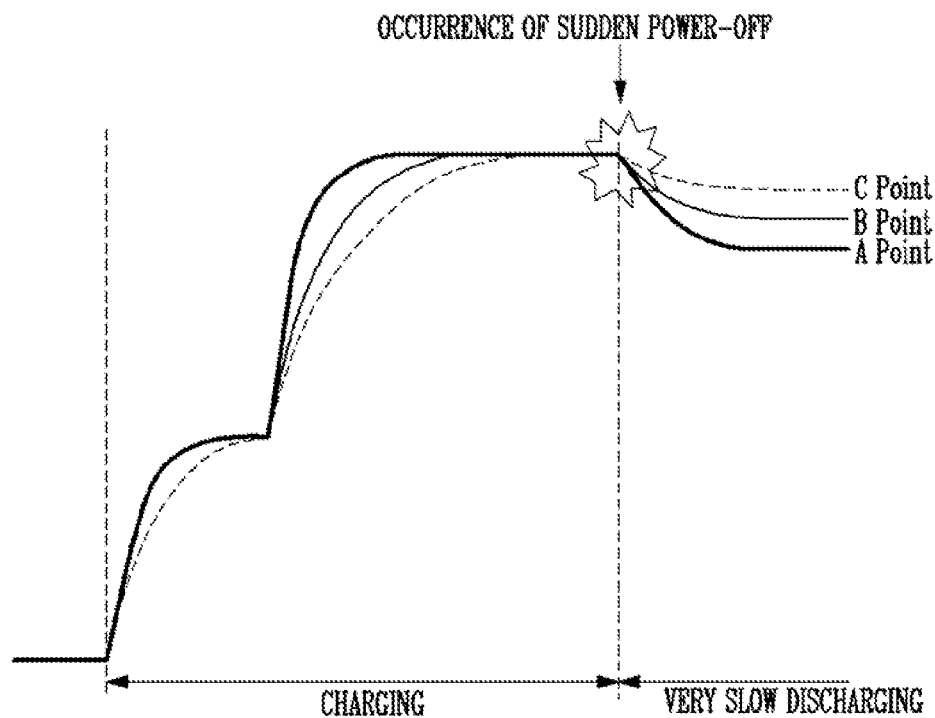
FIGS. 4 and 5 are graphs showing a voltage level in case of sudden power-off.
Figure 5:
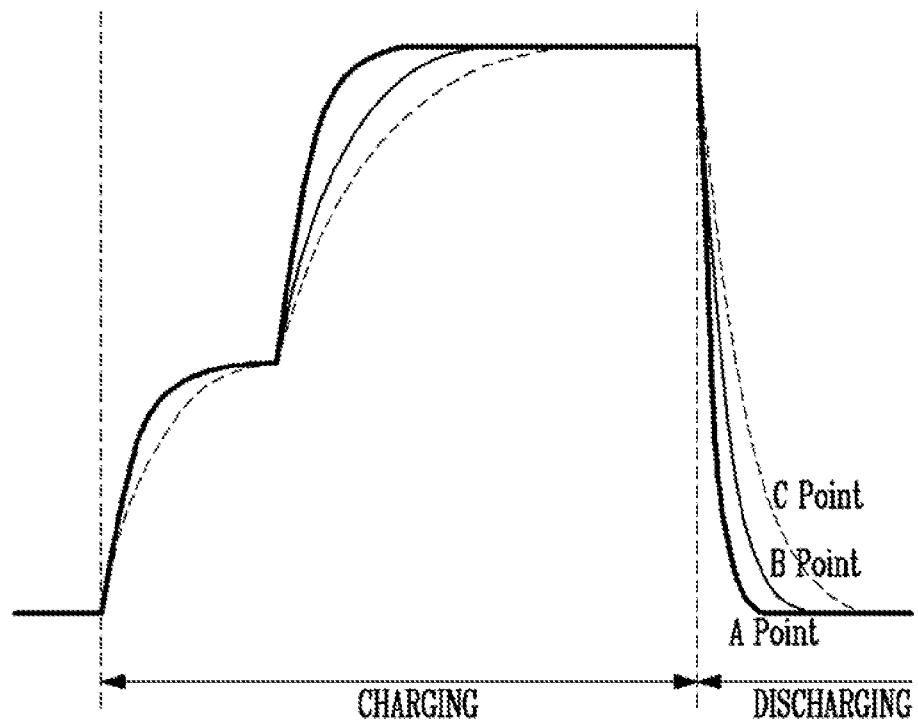

Assuming that a GWL, a near LWL, and a far LWL of FIG. 3 are set as point A, point B, and point C, respectively, FIGS. 4 and 5 are graphs showing measurements of voltage levels of the respective points depending on the presence or absence of a discharge circuit according to the embodiment of the present invention in the case of sudden power-off. In this case, transmission of signals may be delayed due to a parasitic resistor and a parasitic capacitor of the local word line.

First, FIG. 4 shows voltage levels of the respective points when the discharge circuit according to the embodiment of the present invention is absent and sudden power-off occurs. Referring to FIG. 4, point A, point B, and point C may be charged in sequential order because point A is nearest to a point to which a voltage is applied in a normal operation and point C is farthest from the point to which the voltage is applied in the normal operation. After the charge operation ends, sudden power-off may occur during data write, read, and erase operations. In this case, even if there is a difference of degree, the respective points may not be completely discharged but may be maintained at constant voltage levels.

On the other hand, FIG. 5 shows voltage levels of the respective points when the discharge circuit according to the embodiment of the present invention is present and sudden power-off occurs. Referring to FIG. 5, a charge operation may differ little from that of FIG. 4. However, when sudden power-off occurs, a normal discharge operation may be performed so that the respective points may be discharged to voltage levels measured before the charge operation.

As described above, the reference voltage VSSI (e.g., 0V) may be applied to the gate of the depletion high voltage NMOS transistor included in the first circuit DN1. Thus, the discharge circuit 200 according to the embodiment of the present invention may not be affected by variations in external factors but ensure constant operations.

Figure 6:
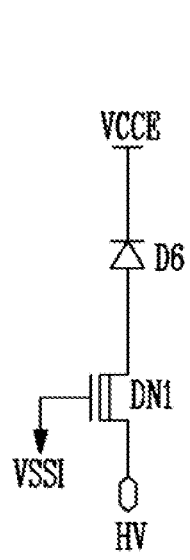
FIG. 6 is a diagram illustrating a discharge circuit according to a second exemplary embodiment of the present invention.
Figure 7:
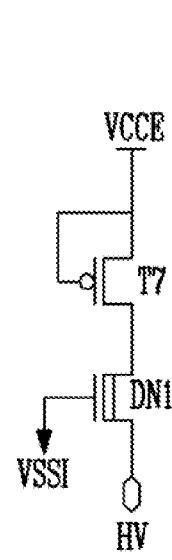
FIG. 7 is a diagram illustrating a discharge circuit according to a third exemplary embodiment of the present invention.

FIG. 6 is a diagram illustrating a discharge circuit 200A according to a second exemplary embodiment of the present invention, and FIG. 7 is a diagram illustrating a discharge circuit 200E according to a third exemplary embodiment of the present invention.

Referring to FIG. 6, in the discharge circuit 200A, a second circuit may include a diode D6 of which a cathode connected to the first node and an anode connected to the second node. Referring to FIG. 7, in the discharge circuit 200B, a second circuit may include a diode-coupled PMOS transistor T7 of which a source connected to the second node and a gate and a drain connected to the first node. Here, the PMOS transistor T7 may be a low voltage transistor.

In the second and third embodiments of the present invention, operations of the first and second circuits may be the same as in the first embodiment. That is, in the first through third embodiments, the second circuit may be regarded as a circuit equivalent to a diode of which a cathode connected to a first node and an anode connected to a second node. Thus, the discharge circuits 200A and 200B may perform the same operations as the discharge circuit 200.

That is, in the first circuit DN1, the threshold voltage Vth_dhvn of the depletion high voltage NMOS transistor may have a negative value, and the reference voltage VSSI (e.g. 0V) is applied to the gate of the depletion high voltage NMOS transistor so that a voltage level of the second node may have a positive value. In this case, since a power supply voltage VCCE is maintained in a normal operation, the second circuit D6 or T7 may be turned-off. When sudden power-off occurs during a normal operation, the power supply voltage VCCE may not be applied, so that a voltage level of the first lode may be dropped. Thus, the second circuit D6 or T7 may be turned-on so that the second node may be discharged through the first node. Accordingly, the high-voltage node may also be discharged to the first node through the second node.

In the second and third embodiments, since the reference voltage VSSI is applied to the gate of the depletion high voltage NMOS transistor of the first circuit DN1, the discharge circuit 200A and 200B may not be affected by variations in external factors but ensure constant operations.

Figure 8:
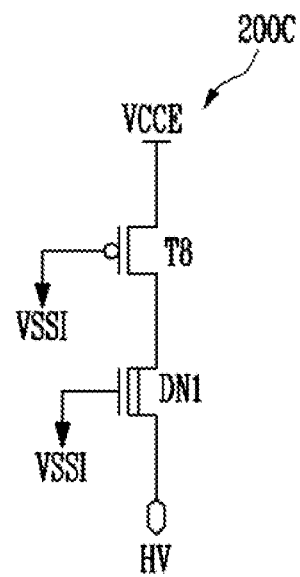
FIG. 8 is a diagram illustrating a discharge circuit according to a fourth exemplary embodiment of the present invention.

FIG. 8 is a diagram illustrating a discharge circuit 200C according to a fourth exemplary embodiment of the present invention.

Referring to FIG. 8, in the discharge circuit 200C, the second circuit may include a PMOS transistor T8 of which a source connected to the second node, a drain connected to the first node, and a gate receiving the reference voltage VSSI.

In the fourth embodiment of the present invention, operations of the first circuit may be the same as in the first embodiment, and the second circuit may have different configurations from that of the first embodiment. Ire the fourth embodiment, the reference voltage VSSI (e.g., 0V) is applied to the gate of the PMOS transistor T8. Since a power supply voltage VCCE is maintained in a normal operation, the PMOS transistor T8 may be turned-off. When sudden power-off occurs during a normal operation, the power supply voltage VCCE may not be applied so that a voltage level of a first node may be dropped. In this case, the PMOS transistor T8 may be turned-on, so the second node may be discharged through the first node. Accordingly, a high-voltage node may also be discharged to the first node through the second node.

In the discharge circuit according to the fourth exemplary embodiment of the present invention, the reference voltage VSSI may be applied not only to a gate of the first circuit but also to a gate of the second circuit. Thus, the discharge circuit may not be affected by variations in external factors but always ensure constant operations depending on whether or not the power supply voltage VCCE is applied.

Figure 9:
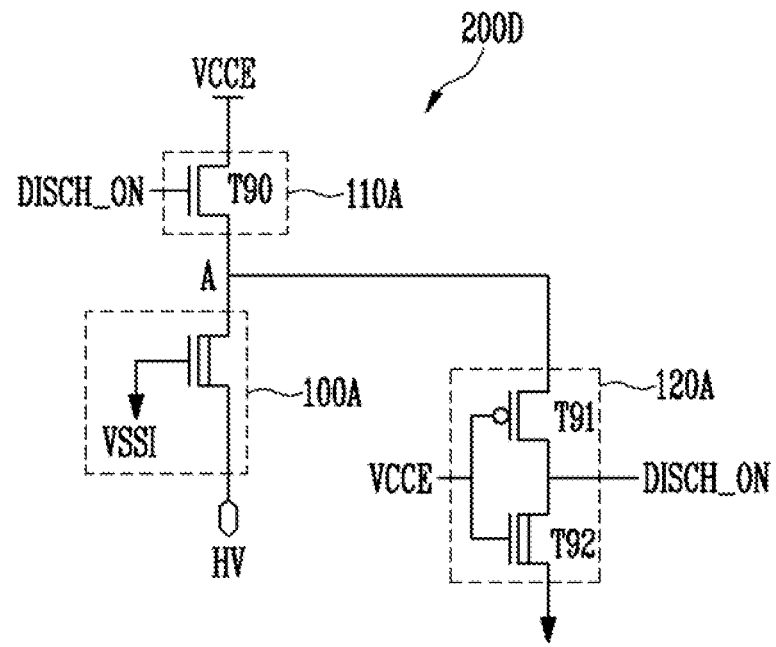
FIG. 9 is a diagram illustrating a discharge circuit according to a fifth exemplary embodiment of the present invention.
Figure 10:
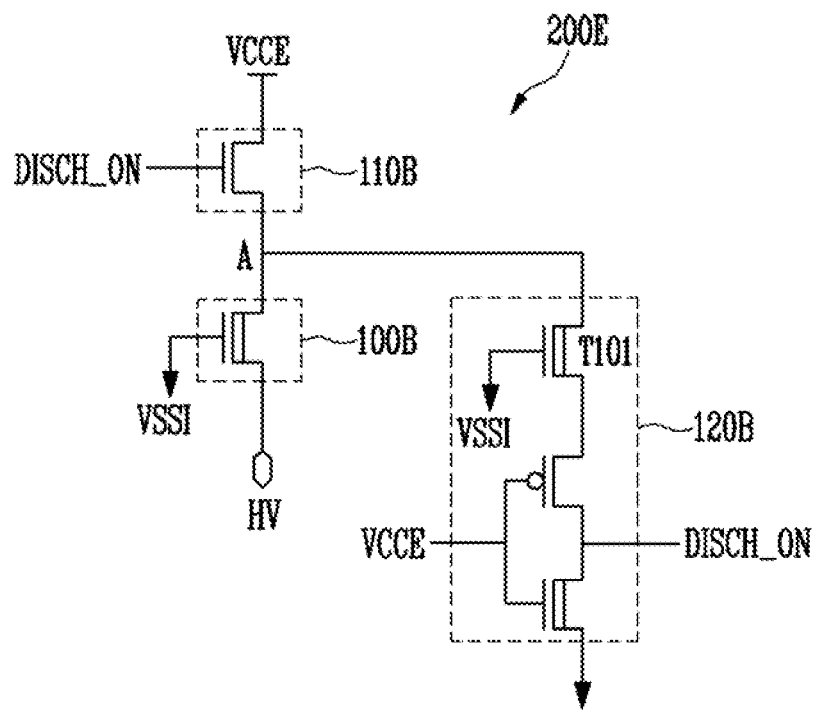
FIG. 10 is a diagram illustrating a discharge circuit according to a sixth exemplary embodiment of the present invention.

FIG. 9 is a diagram illustrating a discharge circuit 200D according to a fifth exemplary embodiment of the present invention, and FIG. 10 is a diagram illustrating a discharge circuit 200E according to a sixth embodiment of the present invention.

Referring to FIG. 9, the discharge circuit 200D may include a first circuit 100A, a second circuit 110A, and a third circuit 120A. Here, the first circuit 100A may have the same configuration as those of the first through fourth embodiments. Further, a second circuit 110A may include a low voltage NMOS transistor T90 of which a source connected to the node A, a drain connected to a VCCE terminal, and a gate receiving a discharge signal DISCH_ON. In addition, the third circuit 120A may include an inverter circuit.

Here, the inverter circuit may include a PMOS transistor T91 of which a source connected to the node A, a drain connected to the output node of the inverter circuit, and a gate receiving the power supply voltage VCCE, and a depletion high voltage NMOS transistor T92 of which a source connected to a ground, a drain connected to the output node of the inverter circuit, and a gate receiving the power supply voltage VCCE. The inverter circuit may output the discharge signal DISCH_ON through the output node thereof. That is, the third circuit 120A may operate as a detection circuit for detecting a sudden power-off.

In the fifth embodiment of the present invention, the second circuit may operate in response to the discharge signal DISCH_ON, which is output from the inverter circuit to which the power supply voltage VCCE is applied as an input signal.

In a normal operation, the power supply voltage VCCE may be applied to the inverter circuit, and an inverted signal (i.e., a ground voltage) of the power supply voltage VCCE may be output from the output node of the inverter circuit as the discharge signal DISCH_ON. The second circuit 110, which may receive the inverted power supply voltage VCCE (i.e., a ground voltage) through the gate serving as a control electrode, may be turned-off. When sudden power-off occurs during a normal operation, the power supply voltage VCCE may be dropped to a ground voltage, and thus the inverter circuit may output a voltage of the node A as the discharge signal DISCH_ON. Accordingly, the second circuit 110A may be turned-on so that the node A may be discharged through the first node. Thus, a high-voltage (HV) terminal may also be discharged to the first node through the second node. In this case, the inverter circuit is connected to the node A and uses a voltage of the node A as a driving voltage. As a result, even in the case of sudden power-off, the discharge circuit 200D may not normally operate.

Referring to FIG. 10 the discharge circuit 200E may include a first circuit 100B, a second circuit 110B, and a third circuit 120B. Here, the first and second circuits 100B and 110B may have the same configuration as those of the discharge circuit 200D shown in FIG. 9. Further, the third circuit 120A may include an inverter circuit. The inverter circuit may further include a depletion high voltage NMOS transistor T101 connected between the node A and the PMOS transistor T91 shown in FIG. 9. The depletion high voltage NMOS transistor T101 may receive a ground voltage as a gate input.

Similarly, in the fifth and sixth embodiments, a reference voltage VSSI e.g., 0V) may be applied to a gate of a depletion high voltage NMOS transistor included in the first circuit 100A or 100B, and the second circuit 110A or 110B may operate in response to an inverted signal of a power supply voltage VCCE. Thus, the discharge circuits 200D and 200E may not be affected by variations in external factors but ensure constant operations.

Figure 11:
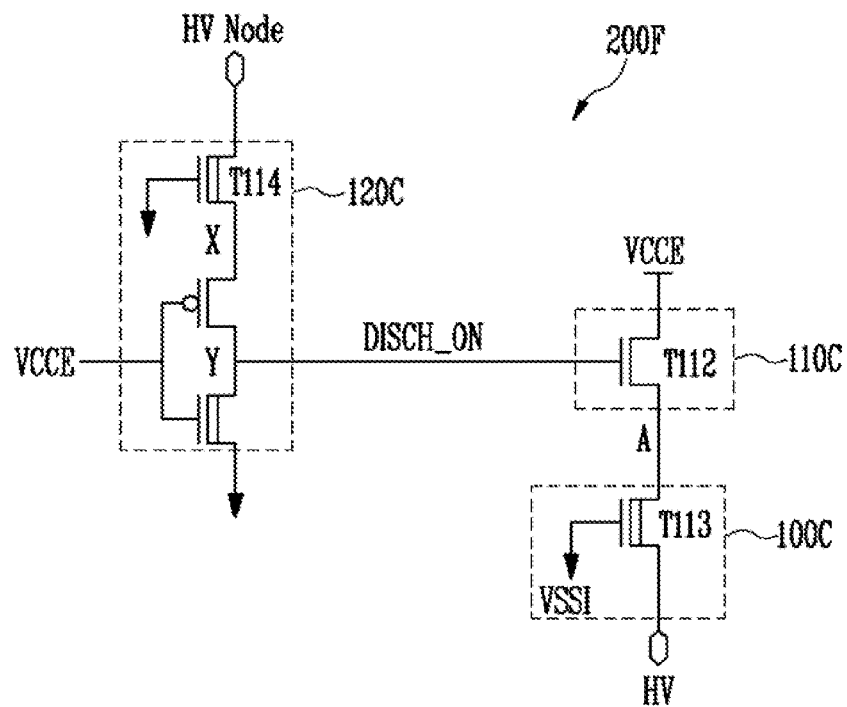
FIG. 11 is a diagram illustrating a discharge circuit according to a seventh exemplary embodiment of the present invention.

FIG. 11 is a diagram of a discharge circuit 200F according to a seventh exemplary embodiment of the present invention.

Referring to FIG. 11, the discharge circuit 200F may include a first circuit 100C, a second circuit 110C, and a third circuit 120C. Here, the first and second circuits 100C and 1100 may have the same configuration as those of the discharge circuits 200D and 200E shown in FIGS. 9 and 10. Further, the third circuit 120C may include an inverter circuit.

In addition in the discharge circuit 200F, the inverter circuit may include a depletion high voltage NMOS transistor T114 of which a source connected to the node X, a drain connected to a node X, and a gate receiving a ground voltage, a PMOS transistor T110 of which a source connected to the node X, a drain connected to the output node (i.e., node Y) of the inverter circuit, a gate receiving the power supply voltage VCCE, and an NMOS transistor T111 of which a source connected to a ground, a drain connected to the node Y, a gate receiving the power supply voltage VCCE.

A threshold voltage Vth_dhvn of the depletion high voltage NMOS transistor T114 of the third circuit 120C may have a negative value. Since a reference voltage VSSI is applied to the gate of the depletion high voltage NMOS transistor T114, a voltage level of the node X may have a positive value. For example, assuming that the depletion NMOS transistor T114 has a threshold voltage Vth_dhvn of about −2.7V, the node X may have a voltage level of about 2.7V. However, a specific value of the threshold voltage Vth_dhvn of the depletion NMOS transistor is not limited thereto and may be appropriately selected depending on demands. The node X may be connected to a driving electrode of the inverter circuit including the PMOS transistor T110 and the NMOS transistor T111 and serve to supply a driving voltage. The inverter circuit included in the third circuit 120C may output the discharge signal DISCH_ON through the node Y.

In a normal operation, the power supply voltage VCCE may be applied to the inverter circuit, and an inverted signal of the power supply voltage VCCE may be output through the node Y. The second circuit 110C, which may receive the inverted power supply voltage VCCE (i.e., a ground voltage) through the gate serving as a control electrode, may be turned-off. When sudden power-off occurs during the normal operation, the ground voltage may be applied to the inverter circuit, and an inverted signal of the ground voltage may be output through the node Y. The second circuit 110C, which may receive the inverted ground voltage through the gate serving as the control electrode, may be turned-on so that the node A may be discharged through the VCCE terminal. Thus, the high-voltage (HV) terminal may also be discharged to the VCCE terminal through the node A.

According to the seventh embodiment of the present invention, the inverter circuit is connected to the node X and uses a voltage of the node X as a driving voltage. That is, similar to the third circuit 120B, the third circuit 120C may operate as a detection circuit for detecting a sudden power-off. Thus, even if sudden power-off occurs, the discharge circuit 200F may operate before the high-voltage node is completely discharged. As a result, the discharge circuit 200F may not be affected by external power supply but normally operate. In addition, since the reference voltage VSSI (e.g., 0V) is applied to the gate of the depletion high voltage NMOS transistor included in the first circuit 100C, the discharge circuit 200F may not be affected by variations in external factors but ensure constant operations.

Figure 12:
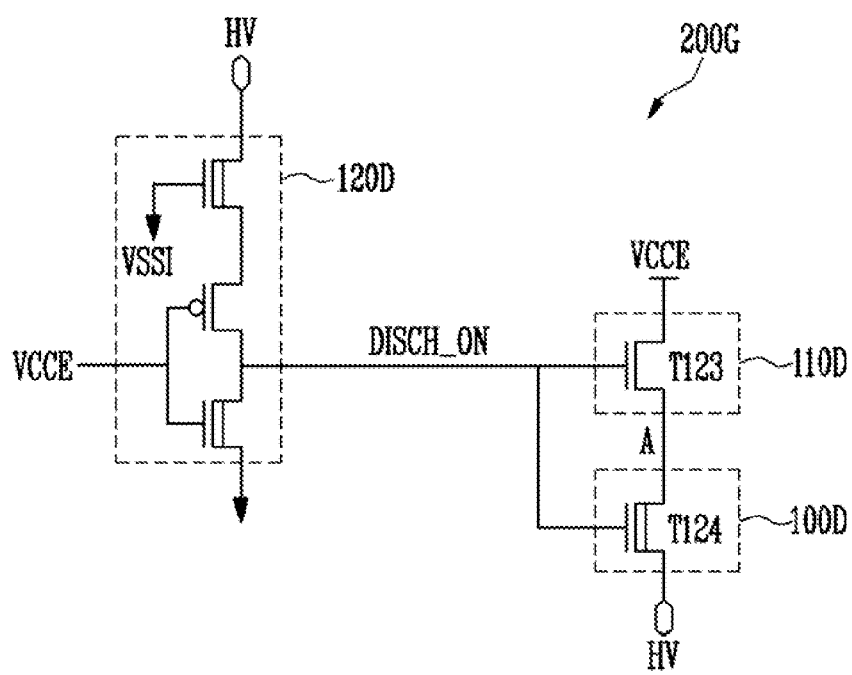
FIG. 12 is a diagram illustrating a discharge circuit according to an eighth exemplary embodiment of the present invention.
Figure 13:
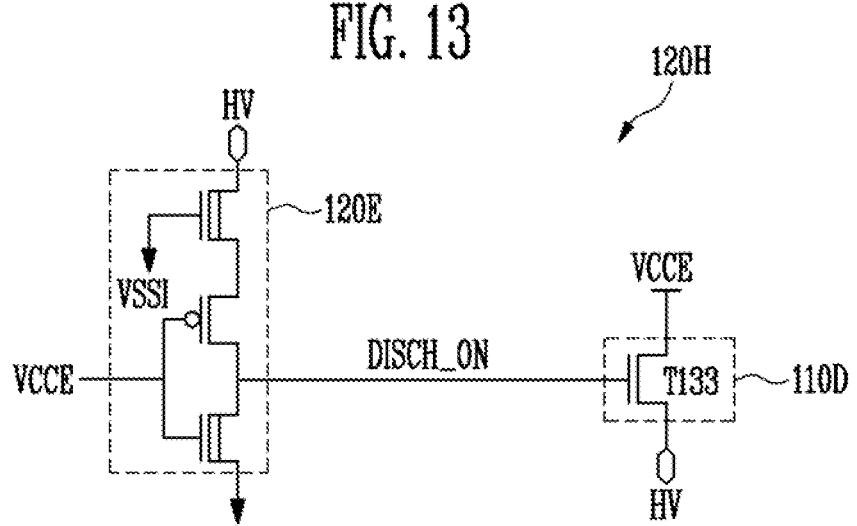
FIG. 13 is a diagram illustrating a discharge circuit according to a ninth exemplary embodiment of the present invention.

FIG. 12 is a diagram illustrating a discharge circuit 200G according to an eighth embodiment of the present invention. FIG. 13 is a diagram illustrating a discharge circuit 200H according to a ninth embodiment of the present invention.

Referring to FIG. 12, the discharge circuit 200G may include a first circuit 1000, a second circuit 110D, and a third circuit 120D. Here, the second and third circuits 110D and 1200 may have the same configuration as those of the discharge circuit 200F shown in FIG. 11.

The first circuit 1000 may include a depletion high voltage NMOS transistor T124 of which a source connected to the node A, a drain connected to a high-voltage (HV) terminal, and a gate receiving the discharge signal DISCH_ON.

That is, when compared to the discharge circuit 200F, the discharge signal DISCH_ON output from an output node of the third circuit 120D may be applied to the first circuit 100D, instead of the reference voltage VSSI (e.g. 0V).

In the eighth embodiment, operations of the discharge circuit 200G may be the same as the discharge circuit 200F. Thus, even if sudden power-off occurs, the discharge circuit 200G may operate before the high-voltage node is completely discharged.

Similar to the third circuit 120C, the third circuit 120D may operate as a detection circuit for detecting a sudden power-off. In a normal operation, an inverted signal (i.e., a ground voltage) of the power supply voltage VCCE may be output as the discharge signal DISCH_ON. The first and second circuits 100D and 110D may be turned-off. When sudden power-off occurs during the normal operation, the power supply voltage VCCE may be dropped to a ground voltage, and thus an inverted signal of the ground voltage may be output as the discharge signal DISCH_ON.

The first and second circuits 100D and 110D may be turned on so that a node A may be discharged through the VCCE terminal. Accordingly, the high-voltage (HV) terminal may also be discharged to the VCCE terminal through the node A.

In the ninth embodiment, the discharge circuit 200H may include a second circuit 110E and a third circuit 120E. Here, the third circuits 120E may have the same configuration as those of the discharge circuits 200F and 200G shown in FIGS. 11 and 12.

Further, the second circuit 110E may include a depletion high voltage NMOS transistor T133 of which a source connected to the VCCE terminal, a drain connected to the high-voltage (HV) terminal, and a gate receiving the discharge signal DISCH_ON. That is, when compared to the discharge circuit 200G the first circuit 100D is removed so that the second circuit 110D n ay be connected directly to the high-voltage (HV) terminal.

The discharge signal DISCH_ON output from the inverter circuit included in the third circuit 120E may be applied to a gate of the depletion high voltage NMOS transistor T133. Accordingly, in a normal operation, the second circuit 110D may be turned-off. In the case of sudden power-off, the second circuit 110D may be turned-on so that the high-voltage (HV) terminal may be discharged through the VCCE terminal.

In the ninth embodiment of the present invention, operations of the discharge circuit 200H may be similar to the discharge circuit 200G. Thus, even if sudden power-off occurs, the discharge circuit 200H may operate before the high-voltage node is completely discharged. As a result, the discharge circuit may not be affected by external power supply but normally operate.

In both the eighth and ninth embodiments, the discharge path in the discharge circuits 200G and 200H may be enabled in response to the discharge signal DISCH_ON to which the detection of a level of the power supply voltage VCCE is incorporated. Accordingly, the discharge circuit may not be affected by variations in external factors but ensure constant operations.

According to the embodiments of the present invention, a discharge circuit may stably perform a discharge operation when sudden power-off occurs.

Typical exemplary embodiments of the invention are disclosed in the above description and the drawings. Although specific terms are employed, they are used in a generic and descriptive sense only and not for purposes of limitation. It will be understood by those of ordinary skill in the art that various changes in form and details may be made to the disclosed embodiments without departing from the spirit and scope of the present invention as defined by the following claims. For example, it will be understood that even if orders, systems, structures, apparatuses, and/or circuits other than in the above-described embodiments are combined in different ways or components of the above-described embodiments are supplemented or replaced with other components or equivalents thereof, uniform effects may be obtained.

What is claimed is:

1. A discharge circuit comprising:
   a first circuit connected between a high-voltage terminal and a connection node, wherein the first circuit includes a depletion NMOS transistor of which a drain connected to the high-voltage terminal, a source connected to the connection node, and a gate receiving a constant reference voltage; and
   a second circuit connected between a power supply voltage terminal and the connection node and suitable for discharging the connection node through the power supply voltage terminal when a power-off of a power supply voltage occurs, wherein the second circuit includes a diode having a cathode connected to the power supply voltage terminal and an anode connected to the connection node, and the diode discharges the connection node through the power supply voltage terminal when a voltage level of the power supply voltage terminal is dropped.

2. The discharge circuit of claim 1, wherein the diode includes an NMOS transistor of which a source connected to the power supply voltage terminal and a gate and a drain connected to the connection node.

3. The discharge circuit of claim 1, wherein the diode includes a PMOS transistor of which a source connected to the connection node and a gate and a drain connected to the power supply voltage terminal.

4. The discharge circuit of claim 1, further comprising:
   an inverter circuit connected between the connection node and a ground terminal and suitable for inputting the power supply voltage and outputting a discharge signal, wherein the second circuit includes an NMOS transistor of which a source connected to the power supply voltage terminal, a drain connected to the connection node, and a gate receiving the discharge signal.

5. The discharge circuit of claim 4, wherein the inverter circuit includes:
   a PMOS transistor of which a source connected to the connection node, a drain connected to an output node of the discharge signal, and a gate receiving the power supply voltage; and
   an NMOS transistor of which a source connected to the ground terminal, a drain connected to the output node of the discharge signal, and a gate receiving the power supply voltage.

6. The discharge circuit of claim 5, further comprising a depletion NMOS transistor of which a drain connected to the connection node, a source connected to the source of the PMOS transistor included in the inverter circuit, and a gate receiving the reference voltage.

7. A discharge circuit comprising:
   a first circuit connected between a high-voltage terminal and a first connection node, wherein first circuit includes a first depletion NMOS transistor of which a drain connected to the high-voltage terminal, a source connected to the first connection node, and a gate receiving a reference voltage;
   an inverter circuit connected between the first connection node and a ground and suitable for outputting a discharge signal in response to a level of a power supply voltage; and a second circuit connected between a power supply voltage terminal and the high-voltage terminal suitable for discharging the high-voltage terminal in response to the discharge signal, wherein the inverter circuit includes:
    an NMOS transistor of which a source connected to a ground terminal, a drain connected to an output node of the discharge signal, and a gate receiving the power supply voltage; and
    a PMOS transistor of which a drain connected to the output node of the discharge signal, and a source connected to the first connection node, and a gate receiving the power supply voltage.

8. The discharge circuit of claim 7, wherein the second circuit includes:
    an NMOS transistor of which a source connected to the power supply voltage terminal, a drain connected to a second connection node, and a gate receiving the discharge signal; and
    an second depletion NMOS transistor of which a source connected to the second connection node, a drain connected to the high-voltage terminal, connected between the output node of the inverter and the fifth node and having and a gate connected to the ground.

9. The discharge circuit of claim 7, wherein the second circuit includes:
    an NMOS transistor of which a source connected to the power supply voltage terminal, a drain connected to a second connection node, and a gate receiving the discharge signal; and
    an second depletion NMOS transistor of which a source connected to the second connection node, a drain connected to the high-voltage terminal, connected between the output node of the inverter and the fifth node and having and a gate receiving the discharge signal.

10. The discharge circuit of claim 7, further comprising a depletion NMOS transistor of which a drain connected to the high-voltage terminal, a source connected to the drain of the depletion NMOS transistor, a gate receiving the discharge signal.

* * * * *